US006833222B1

(12) United States Patent
Buzerak et al.

(10) Patent No.: US 6,833,222 B1
(45) Date of Patent: Dec. 21, 2004

(54) METHOD AND APPARATUS FOR TRIMMING A PELLICLE FILM USING A LASER

(75) Inventors: John E. Buzerak, Poughquag, NY (US); Greg A. Fariss, Poughkeepsie, NY (US); Glenn E. Storm, Ridgefield, CT (US)

(73) Assignee: DuPont Photomasks, Inc., Round Rock, TX (US)

( * ) Notice: Subject to any disclaimer, the term of this patent is extended or adjusted under 35 U.S.C. 154(b) by 283 days.

(21) Appl. No.: 10/100,348

(22) Filed: Mar. 18, 2002

Related U.S. Application Data

(60) Provisional application No. 60/279,843, filed on Mar. 29, 2001.

(51) Int. Cl.⁷ ............................. G03F 9/00; B32B 31/00
(52) U.S. Cl. ........................ 430/5; 156/267; 156/272.8
(58) Field of Search .................. 430/5; 264/5; 156/267, 156/272.8

(56) References Cited

U.S. PATENT DOCUMENTS

| | | | |
|---|---|---|---|
| 5,203,961 A | 4/1993 | Yen ............................. 156/645 |
| 5,327,808 A | 7/1994 | Nagata et al. ................ 83/861 |
| 5,769,984 A | 6/1998 | Yen ............................ 156/73.1 |
| 5,772,817 A | 6/1998 | Yen ............................ 156/73.1 |
| 6,614,504 B2 * | 9/2003 | Aoki et al. ................... 355/30 |

* cited by examiner

Primary Examiner—Saleha R. Mohamedulla
(74) Attorney, Agent, or Firm—Baker Botts L.L.P.

(57) ABSTRACT

A method and apparatus for trimming a pellicle film using a laser are disclosed. A laser trimming assembly includes a modified laser-cutting head coupled to a laser. The laser includes a laser beam for trimming a pellicle film that extends beyond a perimeter of a pellicle frame. The modified laser-cutting head includes a nozzle and at least one hose port located on the nozzle. The hose port may receive a vacuum hose for removing particulate matter created during a trimming process.

19 Claims, 2 Drawing Sheets

METHOD AND APPARATUS FOR TRIMMING A PELLICLE FILM USING A LASER

CROSS REFERENCE TO RELATED APPLICATION

This application claims priority from U.S. Provisional Patent Application Ser. No. 60/279,843 filed Mar. 29, 2001, and entitled "Laser Trimming Of Pellicle Film."

TECHNICAL FIELD OF THE INVENTION

This invention relates in general to the field of optical films and, more particularly, to a method and apparatus for trimming a pellicle film using a laser.

BACKGROUND OF THE INVENTION

Photomasks, commonly referred to as "masks" or reticles, are used in the manufacture of semiconductor integrated circuits (ICs). Photomask are typically made of a transparent substrate on which an opaque patterned layer has been applied. By exposing the photomask to a particular wavelength of light, an image is projected through the photomask onto a semiconductor wafer causing an imprint of the patterned layer on the wafer.

Because a photomask is used to project this image, any defect on the surface of the photomask will result in a transferred imperfection onto the wafer, possibly rendering it useless. Therefore, manufacturers of semiconductor ICs take great care to protect the quality of photomasks used in the manufacturing process. To further protect such photomask quality, pellicles have been developed.

A pellicle protects the quality of an image plane on a photomask by preventing contaminants from collecting in the image plane of the patterned layer that is to be transferred to the wafer. Traditionally, the pellicle is formed by adhering a thin polymer film to a metal or plastic frame. When gluing the film to the frame, the film typically contains an excess portion that extends beyond the edges of the frame. Currently, the excess portion is trimmed by hand with a surgical scalpel blade. Because this mechanical process of cutting the film causes particulate matter, a swabbing step is included to prevent small particles from contaminating the pellicle. A typical swabbing step includes a foam swab wetted with a solvent for removing particles from the trimmed edge and sealing the trimmed edge to the frame. The removal of the particulate matter prevents pellicle contamination and possible rejection of the pellicle for use in the manufacture of semiconductor ICs.

A potential for particulate matter contamination further exists in shipping of a trimmed pellicle. The trimmed pellicle may still contain portions of the pellicle film that extend beyond a pellicle edge when placed into a shipping container. The trimmed edge may come into contact with the shipping container and cause particles to break off, which may further contaminate the pellicle.

SUMMARY OF THE INVENTION

In accordance with the teachings of the present invention, disadvantages and problems associated with a method and apparatus for trimming a pellicle film using a laser have been substantially reduced or eliminated. In particular embodiment, a laser trimming assembly includes a hose port that removes particulate matter from a pellicle during a trimming process.

In one embodiment of the present invention, a laser trimming assembly includes a modified laser-cutting head coupled to a laser. The laser includes a laser beam for trimming a pellicle film that extends beyond a perimeter of a pellicle frame. The modified laser-cutting head includes a nozzle and at least one hose port located on the nozzle. The hose port may receive a vacuum hose that removes particulate matter created during a trimming process.

In another embodiment of the present invention, a method for trimming a pellicle film using a laser includes aligning a laser trimming assembly over a portion of a pellicle film that extends beyond a pellicle frame on a pellicle assembly. The laser trimming assembly uses a laser to trim the pellicle film while following the perimeter of the pellicle frame. During the trimming process, a vacuum source removes particulate matter created during the laser trimming process.

In a further embodiment of the present invention, a pellicle assembly includes a pellicle film coupled to a pellicle frame. A damage resistant film edge is formed on the pellicle frame by removing the pellicle film from over an outer edge of the pellicle frame.

In an additional embodiment of the present invention, a photomask assembly includes a pellicle assembly coupled to a photomask. The pellicle assembly includes pellicle film coupled to a pellicle frame. A damage resistant film edge is formed on the pellicle frame by removing the pellicle film from over an outer edge of the pellicle frame.

Important technical advantages of the present invention include a technique for trimming the pellicle film that removes particulate matter created during the trimming process. In one embodiment, a vacuum hose connects to a nozzle located on a laser trimming assembly. The vacuum hose removes any particulate matter that is released during the trimming process to prevent contaminants from settling on the pellicle assembly.

Another important technical advantage of the present invention includes a laser trimming technique that reduces the time required to trim a pellicle film. Conventional trimming methods often require a technician to trim the edges by hand with a surgical scalpel. Thus, the trimming time is limited by how fast each individual can perform the procedure. Because the laser trimming assembly may be computer controlled, the trimming process may be performed faster and with a greater precision and accuracy than the hand trimming process.

A further important technical advantage of the present invention includes a laser trimming technique that creates a recessed film edge, which eliminates contact between a pellicle film edge and a pellicle assembly shipping box. If any excess portion of a pellicle film extends beyond the edges of a pellicle frame, the excess portion may come in contact with the pellicle assembly shipping box and produce abraded particles. These particles may further contaminate the surface of the pellicle film. By providing a recessed edge, the edge of the pellicle film will generally not come in contact with the pellicle assembly shipping box, thus reducing the possibility of producing extra contaminants on the pellicle assembly surface.

All, some or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the invention and the advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and their advantages are best understood by reference to FIGS. 1 through 5, where like numbers are used to indicate like and corresponding parts.

Figure 1:
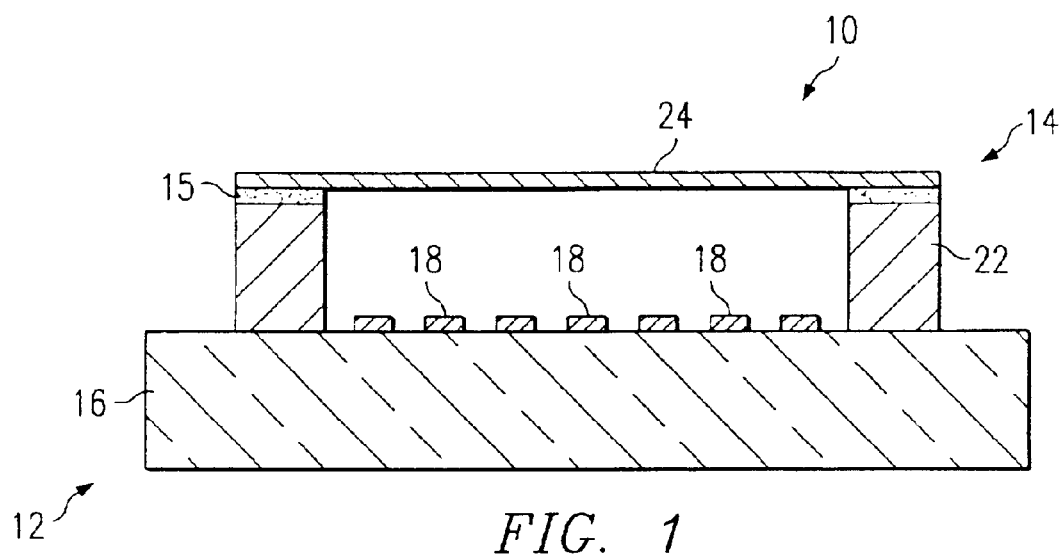
FIG. 1 illustrates a cross-sectional view of a photomask assembly according to the teachings of the present invention.

FIG. 1 illustrates a cross-sectional view of photomask assembly 10. In the illustrated embodiment, photomask assembly 10 includes photomask 12 coupled to pellicle assembly 14. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Substrate 16 may be a transparent material such as quartz, synthetic quartz, fused silica, magnesium fluoride ($MgF_2$), calcium fluoride ($CaF_2$), or any other suitable material that transmits approximately seventy-five percent (75%) of incident light having a wavelength between approximately ten nanometers (nm) and approximately 450 nm. In an alternative embodiment, substrate 16 may be a reflective material such as silicon or any other suitable material that produces a reflectance at the exposure wavelength of greater than approximately fifty percent (50%).

Patterned layer 18 may be a metal material such as chrome, chromium nitride, a metallic oxy-carbo-nitride (M—O—C—N), where the metal is selected from the group consisting of chromium, cobalt, iron, zinc, molybdenum, niobium, tantalum, titanium, tungsten, aluminum, magnesium and silicon, and any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as molybdenum silicide (MoSi), which has a transmissivity of approximately one percent to approximately thirty percent (30%) in the UV, DWV, VUV and EUV ranges.

Pellicle assembly 14 typically includes pellicle frame 22 and pellicle film 24. Pellicle film 24 may be a thin film membrane formed of a material such as nitrocellulose, cellulose acetate, an amorphous fluoropolymer such as Teflon® AF manufactured by E. I. du Pont de Nemours and Company or Cytop® manufactured by Asahi Glass Company, or another suitable film that is transparent to wavelengths in the UV, DUV, EUV and VUV ranges. Pellicle film 24 may be prepared by a conventional technique such as spin casting. Pellicle frame 22 is typically formed of anodized aluminum, although it could alternatively be formed of stainless steel, plastic or any other suitable materials. Pellicle film 24 may be adhered to pellicle frame 22 by adhesive material 15.

As depicted in FIG. 1, pellicle film 24 protects photomask 12 by preventing contaminants from settling on patterned layer 18. Keeping contaminants at a defined distance from patterned layer 18 is critical in a photolithography process. During photolithography, photomask assembly 10 is exposed to focused radiant energy produced by a radiant energy source within a photolithography system. The radiant energy may include light of various wavelengths ranging from 450 nm to 10 nm. In operation, pellicle film 24 is designed to allow greater than ninety-five percent (95%) of the radiant energy to pass through it in order to produce a high quality image from patterned layer 18. By maintaining the contaminants at a fixed distance away from patterned layer 18, any shadow or interference with the radiant light will likely be out of focus at the surface of the wafer. Thus, a clear image of patterned layer 18 may be processed on the wafer in order to produce a high quality semiconductor IC.

Figure 2:
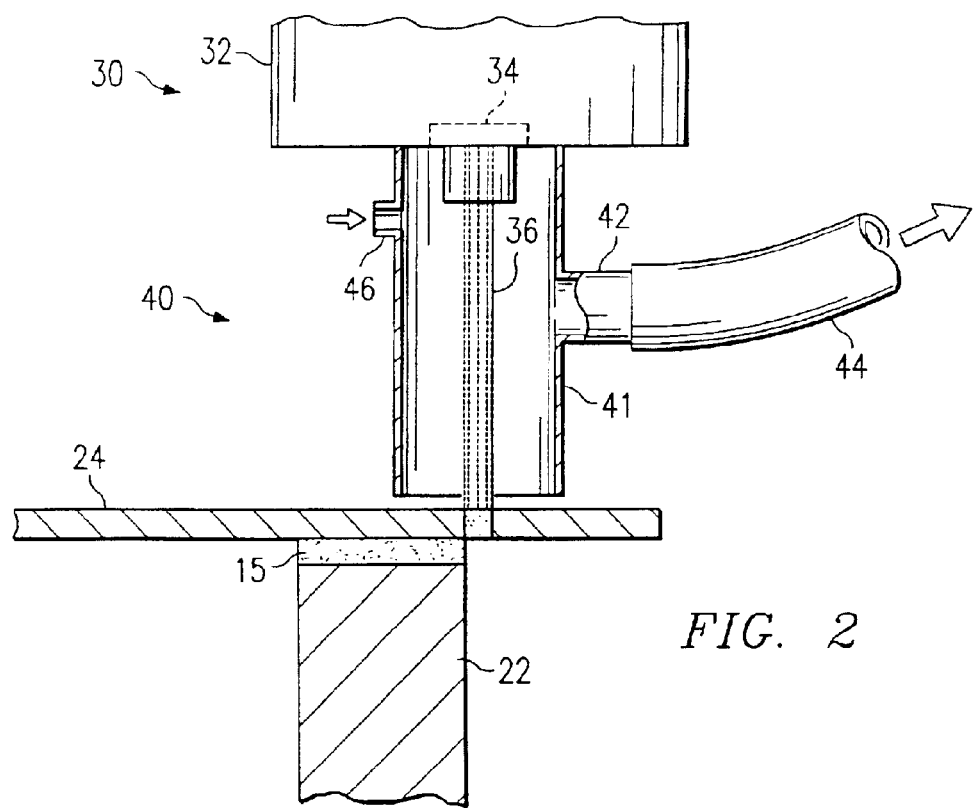
FIG. 2 illustrates a schematic cross-sectional view of one embodiment of a laser trimming assembly used to trim a pellicle assembly according to the teachings of the present invention.

FIG. 2 illustrates a schematic cross-sectional view of laser trimming assembly 30 used to trim pellicle film 24. Laser trimming assembly 30 may be aligned over pellicle assembly 14 to trim pellicle film 24, which extends beyond the perimeter of pellicle frame 22. In certain embodiments, laser trimming assembly 30 includes modified laser-cutting head 40 with nozzle 41, vent port 46 and hose port 42. Laser trimming assembly 30 may utilize laser 32, which may be a continuous wave carbon dioxide laser or any other continuous or pulsed laser suitable for trimming pellicle film 24. Additionally, laser 32 may be controlled by a three or four axis computerized numerical control (CNC) machine or any suitable computerized controller operable to maneuver laser 32 along a cutting path around the perimeter of pellicle assembly 14.

Nozzle 41 forms a part of laser trimming assembly 30 and may be attached to or a separate from laser 32. Nozzle 41 may form a chamber around laser beam 23. Typically the chamber formed by nozzle 41 is tubular in shape, but the chamber may be any shape. Different shapes include round, conical, tube, square, any multi-shaped figure, tapered, straight, offset, any combination thereof, or any shape that allows laser beam 23 to trim pellicle film 24 from pellicle frame 22. In certain embodiments, nozzle 41 may include vent port 46 and at least one hose port 42. Hose port 42 may be placed on any part of nozzle 41 and may be used to connect devices such as vacuum hose 44 to nozzle 41.

Vacuum hose 44 may be attached to hose port 42 or placed separately near a trimming point on pellicle assembly 14. In certain embodiments, vacuum hose 44 is connected to hose port 42 located on nozzle 41. This connection point is typically placed approximately two-thirds of the distance from nozzle 41 attachment point on laser 32. Vacuum hose 44 provides a motive force to collect any particulate matter that may contaminate pellicle assembly 14. Particulate matter may include smoke, adhesive material residue, pellicle film 24 particles, or any other contaminants that may be released during a trimming process. The particulate matter collected by vacuum hose 44 may be stored for disposal or exhausted away from pellicle assembly 14.

Modified laser-cutting head 40 may also include vent port 46 located on nozzle 41. Typically, vent port 46 is located on nozzle 41 near laser beam lens 34. In one embodiment, vent port 46 may allow a stream of air provided by the suction of vacuum hose 44 to enter nozzle 41. By locating vent port 46 near laser beam lens 34, the stream of air entering vent port 46 may divert contaminants away from laser beam lens 34. Preventing contaminants from depositing on laser beam lens 34 permits laser beam 36 to trim and seal pellicle film 24 to pellicle frame 22 without interference from contaminants.

Laser 32 may cause the release of particulate matter resulting from a trimming process. In certain embodiments, laser 32 may include a continuous wave carbon dioxide laser. The features of this type of laser include a constant average power setting to better control the trimming process while generating a reduced amount of peak energy. By reducing the amount of peak energy, laser 32 removes less material from pellicle assembly 14 and prevents damage to the black anodized surface of pellicle frame 22. Damaging pellicle frame 22 may cause the release particulate matter that could contaminate pellicle film 24. Besides decreasing the amount of particulate matter, reducing the amount of peak energy may also provide better control of the trimming process, which may permit a uniform trimmed edge to be formed on pellicle frame 22. If a high peak energy (i.e., a pulsed laser beam) were focused on the pellicle film 24, excessive particulate matter (e.g., smoke) may be released and contaminate pellicle assembly 14 or laser beam lens 34.

In one embodiment, laser trimming assembly 30 may be controlled by a computer system and include laser beam lens 34 and modified laser-cutting head 40. With pellicle assembly 14 placed in laser trimming assembly 30, laser beam 36 trims pellicle film 24 by following the perimeter of pellicle frame 24 in a trimming process. During the trimming process, vacuum hose 44 provides a vacuum source to remove any released particulate matter. Additionally, the vacuum source creates a stream of air, which enters vent port 46 to prevent contaminants from collecting on laser beam lens 34.

Figure 3:
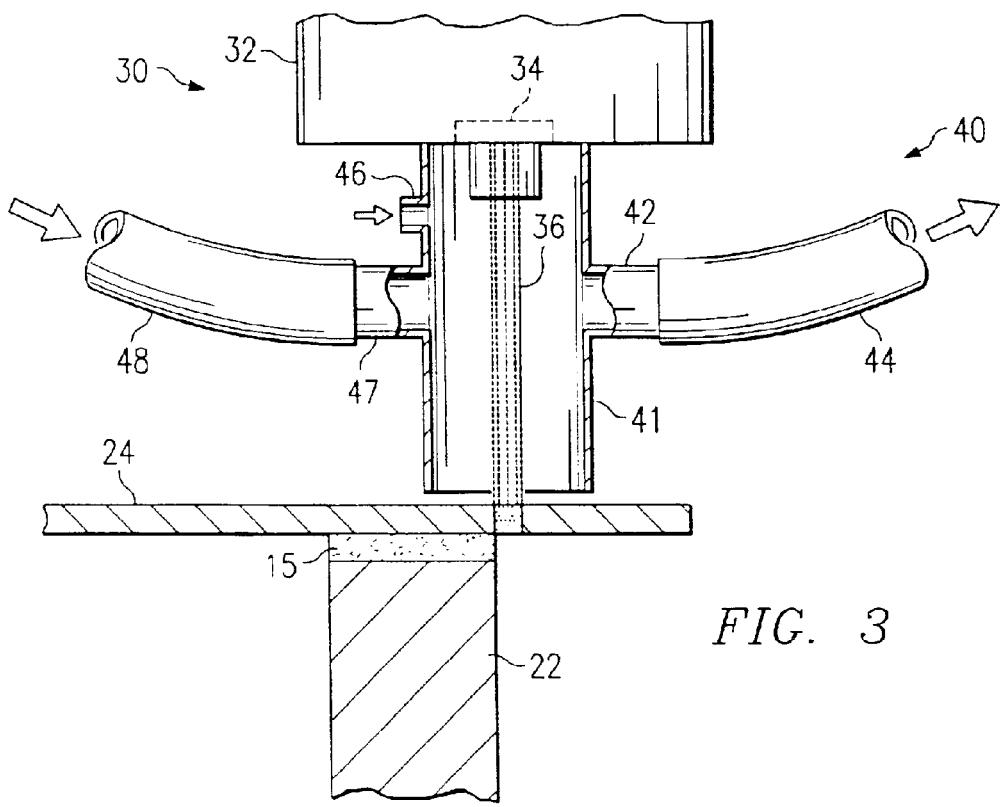
FIG. 3 illustrates a schematic cross-sectional view of another embodiment of a laser trimming assembly used to trim a pellicle assembly according to the teachings of the present invention.

FIG. 3 illustrates a schematic cross-sectional view of laser trimming assembly 30 that includes vent port 46, vacuum hose 44, and forced gas hose 48 connected to nozzle 41 used to trim pellicle film 24. In one embodiment, laser trimming assembly 30 includes modified laser-cutting head 40 and nozzle 41. Nozzle 41 may be attached onto laser 32 to form a chamber surrounding laser beam 36 and may further include vent port 46, hose port 42 and gas hose port 47. Vent port 46 may allow air to enter the portion of the chamber near the laser beam lens 34, by locating vent port 42 at a point between vacuum hose 44 connection point and the point where nozzle 41 attaches to laser 32. Hose port 42 may provide a connection for vacuum hose 44 to laser trimming assembly 30. Gas hose port 47 may provide a connection for forced gas hose 48 to laser trimming assembly 30. In alternate embodiments, hose port 42 and gas hose port 47 are interchangeable.

Forced gas hose 48 may be attached to gas hose port 47, which may be located on nozzle 41 or on a separate hose attachment point not attached to nozzle 41. Additionally, in certain embodiments, forced gas hose 48 and vacuum hose 44 may share a single attachment point, such as hose port 42. In other embodiments, forced gas hose 48 may be attached to hose port 42 and vacuum hose 44 may be attached to gas hose port 47. Forced gas hose 48 may utilize a gas to blow particulate matter away from pellicle assembly 14 either before or after a trimming process. The gas selected for use with forced gas hose 48 may include air, purified air, dehumidified air, compressed air, filtered air, nitrogen, an inert gas, any combination thereof, or any other gas suitable for diverting particulate matter away from pellicle assembly 14. In one particular embodiment, forced gas hose 48 may clean pellicle film 24 by blowing particulate matter away from pellicle assembly 14 using compressed air.

Figure 4:
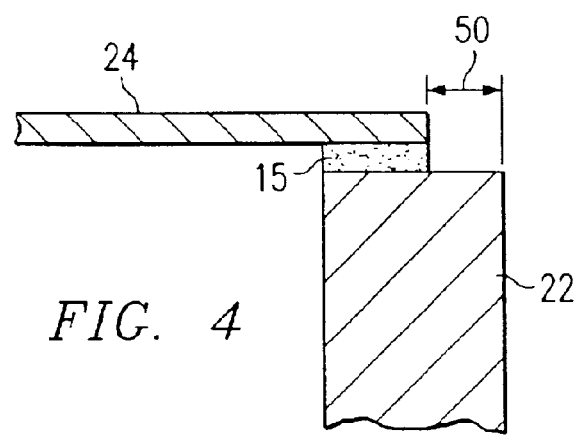
FIG. 4 illustrates a schematic cross-sectional view of a pellicle assembly with a damage resistant film edge according to the teachings of the present invention.

FIG. 4 illustrates a schematic cross-sectional view of pellicle assembly 14 with a damage resistant film edge, such as recessed film edge 50. In certain embodiments, a technique of creating the damage resistant film edge may remove a small portion of pellicle film 24 over pellicle frame 22 to form recessed film edge 50. In a first pass around the perimeter of pellicle frame 22, laser beam 36 trims excess pellicle film 24 from pellicle frame 22 by following the perimeter of pellicle frame 22. Before making a second pass, laser beam 36 may be offset a few thousandths of an inch over the outer edge of pellicle frame 22. The second pass, which may overlap the first pass, removes more pellicle film 24 and adhesive material 15 to expose pellicle frame 22. By having pellicle frame 22 extending beyond pellicle film 24, recessed film edge 50 is created. Although the present embodiment is formed in two passes, recessed film edge 50 may be formed in a single pass or more than two passes due to the configuration of certain pellicle frames.

Recessed film edge 50 may prevent accidental particulate contamination caused during shipping of pellicle assembly 14. During shipping, pellicle assembly 14 may contact a top cover or "bumper cushion" of a shipping box with an exposed edge of pellicle film 24 causing particles of film to break off. These particles may then settle on and contaminate pellicle assembly 14.

Figure 5:
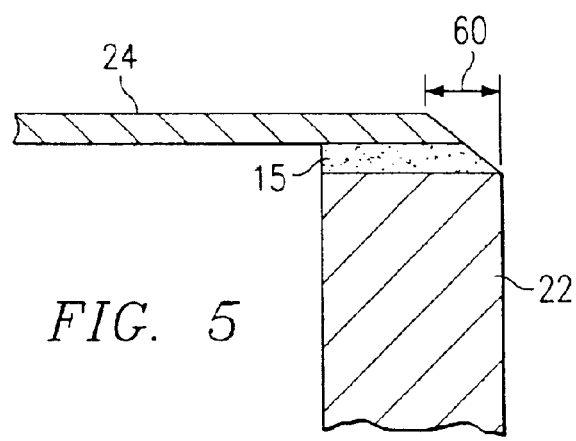
FIG. 5 illustrates a schematic cross-sectional view of a pellicle assembly with another embodiment of a damage resistant film edge according to the teachings of the present invention.

FIG. 5 illustrates a schematic cross-sectional view of pellicle assembly 14 with another embodiment of a damage resistant film edge, such as beveled recessed film edge 60. Another technique of creating a damage resistant film edge may include a gradual removal of pellicle film 24 over pellicle frame 22 to form beveled recessed film edge 60. In one embodiment, optics may be used to alter laser beam 36 to create a specific focal point where the light has the highest energy per unit area. By contrast, utilizing laser beam 36 at a defocused focal point, the energy per unit area is reduced. Using this defocused focal point enables laser beam 36 to trim pellicle film 24 and only remove a small portion of adhesive material 15 binding pellicle film 24 to pellicle frame 22. By adjusting the defocused focal point to further reduce the energy per unit area on each subsequent trimming pass, laser 32 creates beveled recessed film edge 60. By gradually removing less adhesive material 15 from pellicle frame 22, residual adhesive material 15 may prevent particulate matter from breaking off the trimmed edge of pellicle film 24. In an alternate embodiment, laser trimming assembly 30 may form beveled recessed film edge 60 by placing laser 32 over pellicle assembly 14 at an offset angle. The offset angle allows laser beam 36 to trim pellicle film 24 while creating beveled recessed film edge.

Although the present invention has been described in detail, it should be understood that various changes, substitutions, and alterations can be made without departing from the spirit and scope of the invention as defined by the appended claims.

What is claimed is:

1. A method for trimming a pellicle film using a laser, comprising:

aligning a laser trimming assembly over a portion of a pellicle film that extends beyond a pellicle frame on a pellicle assembly;

trimming the pellicle film from the pellicle frame with a laser by following a perimeter of the pellicle frame with the laser; and removing particulate matter created by the trimming process with a vacuum source associated with a nozzle included in a modified laser-cutting head.

2. The method of claim 1, further comprising cleaning the pellicle assembly with a gas provided by a forced gas hose operable to blow particulate matter off the pellicle assembly.

3. The method of claim 1, wherein removing particulate matter created by the trimming process comprises venting a stream of air near a laser beam lens to keep the particulate matter from being deposited on the laser beam lens.

4. The method of claim 1, further comprising forming a damage resistant film edge on the pellicle film.

5. The method of claim 4, further comprising defocusing the laser to create the damage resistant film edge.

6. The method of claim 4, further comprising varying the speed of moving the laser during the trimming process to create the damage resistant film edge.

7. The method of claim 1, wherein trimming the pellicle film from the pellicle frame comprises varying the rate of movement of the laser during the trimming process.

8. The method of claim 1, wherein trimming the pellicle film from the pellicle frame comprises operating the laser in a continuous wave mode.

9. The method of claim 1, further comprising positioning the laser trimming assembly over the pellicle assembly at an angle offset from perpendicular to a surface of the pellicle film to create a damage resistant film edge.

10. The method of claim 1, further comprising controlling the trimming process with a computer control system.

11. The method of claim 4, wherein forming a damage resistant film edge on the pellicle film comprises trimming an additional portion of the pellicle film adjacent the pellicle frame with the laser to form a recessed film edge.

12. The method of claim 11, wherein:

trimming the pellicle film from the pellicle frame with a laser by following a perimeter of the pellicle frame with the laser comprises trimming a first portion of the pellicle frame extending beyond an outer edge of the pellicle frame; and trimming an additional portion of the pellicle film adjacent the pellicle frame with the laser to form a recessed film edge comprises trimming a second portion of the pellicle film not extending beyond the outer edge of the pellicle frame.

13. The method of claim 4, wherein forming a damage resistant film edge on the pellicle film comprises trimming an additional portion of the pellicle film adjacent the pellicle frame with the laser to form a beveled recessed film edge.

14. A method for trimming a pellicle film using a laser, comprising:

aligning a laser trimming assembly over a portion of a pellicle film that extends beyond a pellicle frame on a pellicle assembly;

trimming the pellicle film from the pellicle frame with a laser by following a perimeter of the pellicle frame with the laser; and forming a damage resistant film edge on the pellicle film.

15. The method of claim 14, further comprising defocusing the laser to create the damage resistant film edge.

16. The method of claim 14, further comprising varying the speed of moving the laser during the trimming process to create the damage resistant film edge.

17. The method of claim 14, wherein forming a damage resistant film edge on the pellicle film comprises trimming a portion of the pellicle film adjacent the pellicle frame with the laser to form a recessed film edge.

18. The method of claim 14, wherein forming a damage resistant film edge on the pellicle film comprises trimming a portion of the pellicle film adjacent the pellicle frame with the laser to form a beveled recessed film edge.

19. The method of claim 14, further comprising removing particulate matter created by the trimming process with a vacuum source associated with a nozzle included in a modified laser-cutting head.

* * * * *